United States Patent
Nadd

(10) Patent No.: US 7,636,005 B2
(45) Date of Patent: Dec. 22, 2009

(54) ACTIVE CLAMP FOR SEMICONDUCTOR DEVICE

(75) Inventor: Bruno Charles Nadd, Lourmarin (FR)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/205,022

(22) Filed: Sep. 5, 2008

(65) Prior Publication Data
US 2009/0066395 A1    Mar. 12, 2009

Related U.S. Application Data

(60) Provisional application No. 60/970,692, filed on Sep. 7, 2007.

(51) Int. Cl.
  *H03K 5/08* (2006.01)
(52) U.S. Cl. .................. 327/309; 327/327; 327/328
(58) Field of Classification Search ........... 327/306, 327/309, 313, 318, 327, 328
See application file for complete search history.

(56) References Cited

U.S. PATENT DOCUMENTS

| 5,530,271 A | 6/1996 | Fallica |
| 5,886,487 A | 3/1999 | Khayat et al. |
| 5,945,877 A * | 8/1999 | Elango et al. ............... 330/156 |
| 6,737,301 B2 | 5/2004 | Eden et al. |
| 2006/0006851 A1 | 1/2006 | Thiery |
| 2007/0076338 A1 | 4/2007 | Traynor et al. |

* cited by examiner

*Primary Examiner*—Lincoln Donovan
*Assistant Examiner*—Patrick O'Neill
(74) *Attorney, Agent, or Firm*—Farjami & Farjami LLP

(57) ABSTRACT

An active clamp circuit for avalanching and clamping voltage at a gate terminal of a first transistor connected to a power source. The active clamp circuit includes a second transistor for turning ON the first transistor; a third transistor having EPI breakdown voltage less than that of the first transistor; a resistor coupled between a node and source and gate terminals of the third transistor; and an amplifier for comparing voltage on the resistor to a reference voltage and providing an output signal to control the second transistor, wherein, when the third transistor avalanches and the voltage across the resistor exceeds the reference voltage, the output signal turns ON the second transistor thereby clamping the gate terminal of the first transistor, wherein the active clamp circuit tracks the channel characteristic of the first transistor.

12 Claims, 1 Drawing Sheet

ACTIVE CLAMP FOR SEMICONDUCTOR DEVICE

CROSS-REFERENCE TO RELATED APPLICATION

This application is based on and claims priority to U.S. Provisional Patent Application Ser. No. 60/970,692, filed on Sep. 7, 2007 and entitled ACTIVE CLAMP FOR SEMICONDUCTOR DEVICE, the entire contents of which are hereby incorporated by reference.

BACKGROUND OF THE INVENTION

The present invention relates to an active clamp circuit for a semiconductor device and, in particular, to an active clamp circuit which tracks the characteristics of a main power MOSFET to clamp just below the EPI breakdown voltage of the power MOSFET.

FIG. 1 shows an active clamp circuit 10 that includes a main power transistor Q1, i.e., a DMOS MOSFET, having source, drain, and gate terminals; a transistor Q2, e.g., bipolar, having collector, emitter, and base terminals; two series connected Zener diodes Z1 and Z2, with a cathode terminal of the Zener diode Z2 connected to an anode terminal of the Zener diode Z1; and a resistor R. The drain terminal of the main power transistor Q1 is connected to the collector terminal of the transistor Q2, a cathode terminal of the Zener diode Z1, and to a power source. The source terminal of the main power transistor Q1 is connected to a first terminal of the resistor R. The gate terminal of the main power transistor Q1 is connected to a second terminal of the resistor R and the emitter terminal of the transistor Q2. The base terminal of the transistor Q2 is connected to an anode terminal of the Zener diode Z2. The transistor Q1 switches power to a load, not shown.

When the Zener diodes Z1, Z2 avalanche, the active clamp circuit 10 clamps voltage at the gate terminal of the main power transistor Q1. As shown in FIG. 2, the clamp voltage is set at just below the EPI breakdown voltage of the main power transistor Q1. In FIG. 2 the EPI breakdown voltage is shown at approximately 45 volts, thus, the clamp voltage is somewhat below this voltage of 45 volts.

The clamp voltage of the active clamp circuit 10 is given by the following equation:

$$nVz + V_{BE} + V_{gon} = V_{clamp}.$$

The Zener diodes do not track the FET channel.

SUMMARY OF THE INVENTION

It is an object of the present invention to provide an active clamp circuit that tracks the FET channel characteristics of the main power MOSFET.

It is another object of the present invention to provide an active clamp circuit to clamp just below the EPI breakdown voltage of the power MOSFET.

Provided is an active clamp circuit for avalanching and clamping voltage at a gate terminal of a first transistor connected to a power source. The active clamp circuit includes a second transistor for turning ON the first transistor; a third transistor having EPI breakdown voltage less than that of the first transistor; a resistor coupled between a node and source and gate terminals of the third transistor; and an amplifier for comparing voltage across the resistor to a reference voltage and providing an output signal to control the second transistor, wherein, when the third transistor avalanches and the voltage across the resistor exceeds the reference voltage the output signal turns ON the second transistor thereby clamping a gate terminal of the first transistor, wherein the active clamp circuit tracks the channel characteristic of the first transistor.

Other features and advantages of the present invention will become apparent from the following description of the invention that refers to the accompanying drawings.

DETAILED DESCRIPTION OF EMBODIMENTS OF THE INVENTION

According to the invention, a MOSFET clamp is employed that is spaced away from the main DMOS to ensure that it operates at a lower temperature especially during clamping and at high temperatures. The MOSFET clamp will track the main MOSFET. The active clamp will avalanche at a lower voltage if spaced at least one times the thickness of the wafer away from the main DMOS. For example, the active clamp will avalanche at 40 volts instead of 42 volts.

To ensure tracking, the self-tracking clamp is spaced from the main power MOSFET by at least one thickness of the wafer.

Figure 1:
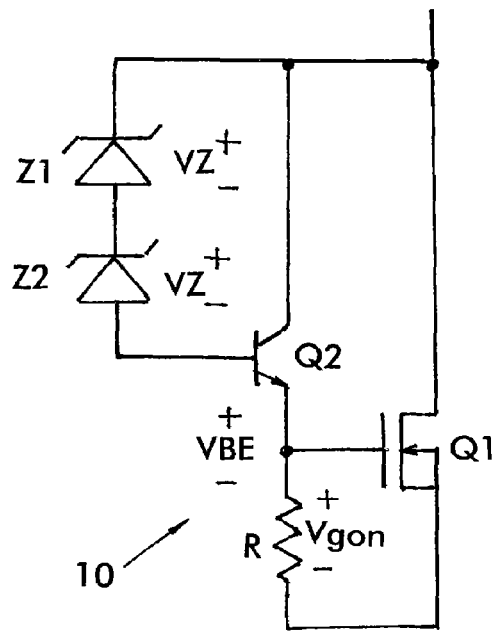
FIG. 1 is a circuit diagram of a prior art active clamp circuit.
Figure 2:
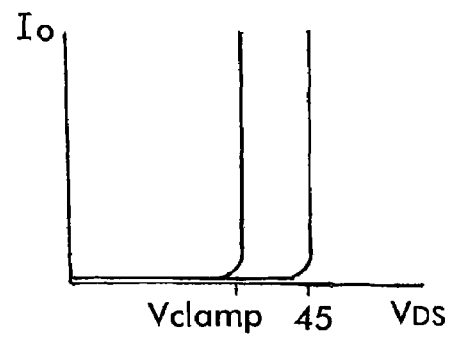
FIG. 2 is a graph illustrating that the clamping action of the active clamp circuit of FIG. 1 spaced at least one times the thickness of the wafer away from the main DMOS will avalanche at a lower voltage.
Figure 3:
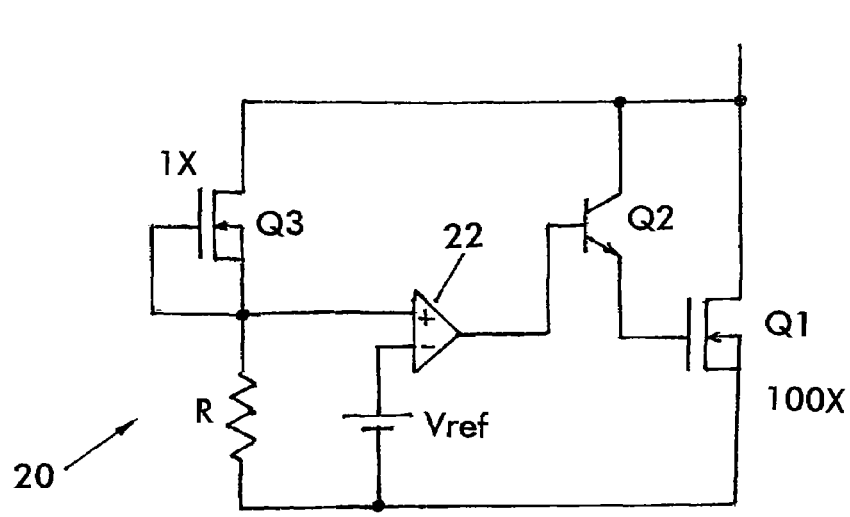
FIG. 3 is a circuit diagram of an active clamp circuit of the present invention.

FIG. 3 shows a clamp circuit 20 of the present invention. As in the circuit of FIG. 1, the circuit 20 includes the main power transistor Q1; the transistor Q2; a transistor Q3, i.e., a MOSFET, having source, drain, and gate terminals; a resistor R; and an amplifier 22. The drain terminal of the main power transistor Q1 is connected to the collector terminal of the transistor Q2, the drain terminal of the transistor Q3, and to the power source. The source terminal of the main power transistor Q1 is connected to a first terminal of the resistor R, while a second terminal of the resistor R is connected to the source and gate terminals of the transistor Q3 and the non-inverting input terminal of the amplifier 22. The gate terminal of the main power transistor Q1 is connected to the emitter terminal of the transistor Q2. The base terminal of the transistor Q2 is connected to an output terminal of the amplifier 22. The inverting input terminal of the amplifier 22 is connected to a reference source Vref.

When the transistor Q3 avalanches, and the voltage across the resistor R exceeds Vref, the transistor Q2 goes ON, clamping the gate of the main power transistor Q1. The breakdown voltage BVds of the transistor Q3 is less than that of the transistor Q1. The transistor Q3 runs cooler than the main power transistor Q1 because of the spacing, i.e., at least one thickness of the wafer. However, the transistor Q3 will track the main power transistor Q1 because it has the same wafer characteristics.

Accordingly, by spacing the active clamp transistor Q3, i.e., at least one times the thickness away from the main power transistor Q1, this will ensure that the clamp circuit tracks the characteristics of the FET and clamps just below the EPI breakdown voltage of the power transistor.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An active clamp circuit for avalanching and clamping voltage at a gate terminal of a first transistor connected to a power source, the active clamp circuit comprising:
   a second transistor for turning ON the first transistor;
   a third transistor having an epitaxial layer breakdown voltage less than that of the first transistor;
   a resistor coupled between a node and source and gate terminals of the third transistor; and
   an amplifier for comparing voltage on the resistor to a reference voltage and providing an output signal to control the second transistor, wherein, when the third transistor avalanches and the voltage across the resistor exceeds the reference voltage the output signal turns ON the second transistor thereby clamping a gate terminal of the first transistor,
   wherein the active clamp circuit tracks the channel characteristic of the first transistor.

2. The active clamp circuit of claim 1, wherein the first transistor is a DMOS MOSFET main power transistor, the second transistor is a bipolar transistor, and the third transistor is a MOSFET.

3. The active clamp circuit of claim 1, wherein the active clamp circuit and first transistor are disposed on a wafer, and the third transistor is spaced at least one times the thickness of the wafer away from the first transistor to avalanche at a lower voltage during clamping.

4. An active clamp circuit for a first transistor having source, drain, and gate terminals, the drain terminal of the first transistor being connected to a power source, wherein, when the active clamp circuit avalanches, voltage at the gate terminal of the first transistor is clamped, the active clamp circuit comprising:
   a second transistor having collector, emitter, and base terminals, where the collector terminal of the second transistor is connected to the drain terminal of the first transistor and the emitter terminal of the second transistor is connected to the gate terminal of the first transistor;
   a third transistor, having source, drain, and gate terminals, the drain terminal of the third transistor is connected to the drain terminal of the first transistor; and
   an amplifier having a first input terminal connected to the gate and source terminals of the third transistor and an output terminal connected to the base terminal of the second transistor and further having a second input terminal connected to a reference,
   wherein the active clamp circuit tracks the channel characteristic of the first transistor.

5. The active clamp circuit of claim 4, wherein the first transistor is a DMOS MOSFET main power transistor, the second transistor is a bipolar transistor, and the third transistor is a MOSFET.

6. The active clamp circuit of claim 4, wherein the third transistor is spaced away from the first transistor to ensure that it operates at a lower temperature during clamping and at high temperatures.

7. The active clamp circuit of claim 4, wherein the third transistor is disposed on a wafer with the first transistor and is spaced at least one times the thickness of the wafer away from the first transistor to avalanche at a lower voltage.

8. The active clamp circuit of claim 7, wherein the third transistor runs cooler than the first transistor because of its spacing at least one thickness of the wafer away from the first transistor.

9. The active clamp circuit of claim 4, wherein clamp voltage is set at just below the epitaxial layer breakdown voltage of the first transistor.

10. The active clamp circuit of claim 4, further comprising a resistor connected between the source terminals of the first and third transistors.

11. The active clamp circuit of claim 10, wherein the second transistor goes ON clamping the gate terminal of the first transistor when the third transistor avalanches and the voltage across the resistor exceeds the reference voltage.

12. The active clamp circuit of claim 11, wherein breakdown voltage of the third transistor is less than that of the first transistor.

* * * * *